United States Patent [19]

Bryden

[11] 4,070,588
[45] Jan. 24, 1978

[54] LIMITER CIRCUIT FOR TIMING RECOVERY IN A HIGH SPEED DIGITAL REPEATER

[75] Inventor: Brian Richard Bryden, Fitzroy Harbour, Canada

[73] Assignee: Northern Electric Company Limited, Montreal, Canada

[21] Appl. No.: 630,252

[22] Filed: Nov. 10, 1975

[51] Int. Cl.² .............................................. H03K 5/08
[52] U.S. Cl. .................................. 307/237; 307/264; 307/290; 328/169
[58] Field of Search ............... 307/237, 262, 264, 290; 328/55, 155, 164, 169, 171; 333/18, 28 R; 179/15 AD, 16 E, 16 EA; 178/70 S, 70 TS, 71 M, 71 N

[56] References Cited

U.S. PATENT DOCUMENTS

| | | |
|---|---|---|
| 3,054,910 | 9/1962 | Bothwell ......................... 307/235 T |
| 3,529,184 | 9/1970 | Conklin ................................ 307/290 |
| 3,548,215 | 12/1970 | Hoover ................................ 307/237 |
| 3,584,241 | 6/1971 | Nakamura ............................ 307/290 |
| 3,622,699 | 11/1971 | Richeson, Jr. ................... 307/290 X |

*Primary Examiner*—John Zazworsky
*Attorney, Agent, or Firm*—Achmed N. Sadik

[57] ABSTRACT

A limiter circuit for the extracted timing signal in high speed digital repeaters is disclosed. The conventional emitter-coupled transistor pair limiter is modified by applying to the base of the output transistor the decoupled, attenuated, and delayed signal at the collector of the input transistor. The delay is such that the compensating signal at the base is out-of-phase with respect to the input signal by approximately $-5/2\pi$. Experimental determination of delay and attenuation yields optimal phase and amplitude responses which are a significant improvement over those of the conventional limiter.

24 Claims, 6 Drawing Figures the

LIMITER CIRCUIT FOR TIMING RECOVERY IN A HIGH SPEED DIGITAL REPEATER

FIELD OF THE INVENTION

The present invention relates to electrical signal limiting circuits in general, and in particular to a transistor limiter circuit suitable for timing circuits in high speed digital repeaters.

BACKGROUND AND PRIOR ART OF THE INVENTION

In recent years the digital transmission of information by means of high speed, high capacity pulse transmission systems has gained a foothold as a viable mode in long haul telephony applications. These systems are capable of carrying a few hundred megabits per second of information over repeatered coaxial cable lines. To maintain the integrity of the digital pulses over the total system from end to end, digital repeaters are placed at intervals dependent on the type of coaxial cable, the bandwidth of the transmitted information and the error rate specified for the total system. A digital repeater intercepts the incoming pulse streams to reshape and retime the dispersed pulses, thereafter retransmitting them onto the following cable interval.

An essential function in a repeater is performed by a threshold detector, which during an optimum time-window decides on the existence or absence of a pulse by sensing a voltage above a predetermined threshold. The accuracy of this decision largely determines the error rate of the system. Clearly such accuracy is a function of two variables, first the integrity of the incoming pulses that are ultimately presented to the threshold detector, and secondly on the position (in time) of the optimum time-window. This position is derived from the timing circuit which extracts a sinusoidal timing signal from the incoming pulse stream. The extracted sinusoid possesses the proper phase necessary for accurate timing, but varies in amplitude due mainly to the quasi-random occurrence of incoming pulses. A dense sequence of pulses produces larger amplitude than a not so dense sequence. There is, however, a lower limit set by the coding scheme of the multiplexing system, so that a repeater has to contend with only a variation in amplitude limited in most cases to between 10 and 20 dB.

In order to remove the amplitude variation from the timing signal, which is necessary for proper timing, the raw timing signal must be amplified and thereafter limited. As may be expected, the phase response of the limiter is of prime importance. It must be constant within preset tolerances over the region of amplitude fluctuation. Hence, limiting was accomplished by diodes in two consecutive stages superceded each by sufficient amplification and followed by yet a third amplifier stage. In an alternative, a series-shunt limiter was utilized which is preceded and followed by amplification. Such an arrangement is disclosed in the article by I. Dorros et al titled: "An Experimental 224 Mb/s Digital Repeatered Line", published in The Bell System Technical Journal, Vol. XLV, September 1966, Number 7, at page 1029. Under the heading "Limiting" in that article the authors teach that transistor limiting was avoided in order to keep amplitude-to-phase conversion at a minimum (i.e. the phase response constant). In that instance, as in other prior art limiters for the application in question, diode limiting is utilized.

SUMMARY OF THE INVENTION

The primary concern of the present invention was cost reduction of the digital repeaters of the type discussed above. It was recognized that if the phase-response problems of transistorized limiting stages could be solved, only one simpler amplifier stage would be required to drive the more sensitive limiter, and possibly no post amplification would be necessary. A not insignificant cost reduction would result.

It was found that the conventional emitter-coupled pair limiter would yield significantly improved phase-response if a second phase compensating signal was applied to the base of the output transistor, which signal bears a certain phase relationship to the input signal. By judicious choice of the amplitude of that second signal relative to the range of variation in amplitude of the input signal, the phase and amplitude responses of the limiter are optimized for the case at hand.

Thus, in accordance with the present invention, a limiter circuit for a periodic input signal having varying amplitude is provided comprising, first and second switching devices connected and biased to operate in current mode switch operation; means for applying said input signal to a control electrode of said first switching device; and means for applying a second periodic signal to a control electrode of said second switching device, said second signal having, at the control electrode, a predetermined amplitude and a predetermined difference in phase with respect to said input signal.

In a narrower, preferred aspect of the present invention said second signal is a delayed, attenuated version of the a-c signal appearing at the output-electrode of said first switching device.

BRIEF DESCRIPTION OF THE DRAWINGS

A preferred embodiment of the present invention will now be described in conjunction with the accompanying drawings, in which.

DETAILED DESCRIPTION OF THE PREFERRED EMBODIMENT

Figure 1:
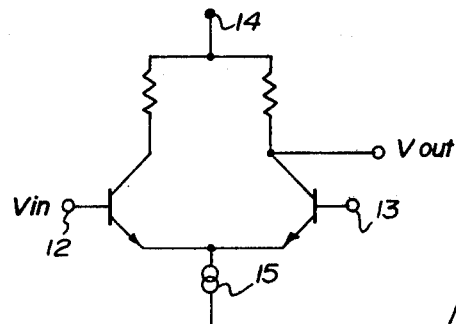
FIG. 1 is a general schematic of a conventional emitter-coupled pair limiter.

A general schematic of the conventional emitter-coupled limiter is shown in FIG. 1. The input signal $V_{in}$ is applied to base 12 of transistor 10, and the output voltage $V_{out}$ is obtained at the collector of transistor 11. The base 12 as well as base 13 of the transistor 11 should, of course, be biased at substantially the same d.c. voltage by any of the well known biasing means. The supply voltage is applied between terminal 14 and ground. Current source 15 could be a simple resistor. Variations of the general schematic of FIG. 1 are well known in the art and further discussion thereof may be found in basic textbooks.

Figure 2:
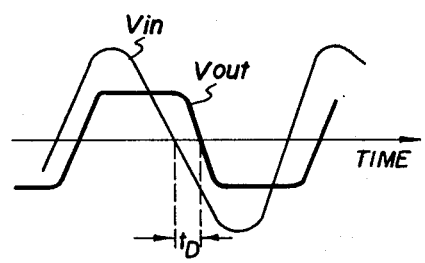
FIG. 2 illustrates the definition of propagation delay of the emitter-coupled pair in FIG. 1.

FIG. 2 illustrates how the propagation delay $t_D$ between $V_{in}$ and $V_{out}$ is defined. The d.c. levels have been ignored for clarity of definition, which simply is the time delay $t_D$ between the 50% points of $V_{out}$ and $V_{in}$.

At a single frequency $t_D$ may be converted into a phase angle, the variation of which as a function of the amplitude of $V_{in}$ constitutes what is here termed "phase response", or amplitude-to-phase conversion, of the limiter. A typical phase response of such a conventional limiter at the frequency of interest in the preferred embodiment of 274.176 MHz is shown in the lower portion of FIG. 3. The ordinate represents the phase angle in degrees, while the abscissa represents the relative change in amplitude of $V_{in}$ as a ratio of $V_{in}$ to $V_{in,max}$. $V_{in,max}$ is the expected maximum value of the amplitude at the limiter input (the terminal 12 in FIG. 1). As may be seen the phase response is far from constant, such that this type of limiter, while more sensitive than diode limiters, is unsuitable for application in the high speed repeaters at hand.

Not only is the phase response too dependent on amplitude, but so is the amplitude of the limited output signal, although to a lesser degree. The amplitude response, or amplitude-to-amplitude conversion, is shown in the upper portion of FIG. 3. The ordinate represents relative variation in the output amplitude. $V_{out,max}$ is the maximum output amplitude corresponding to $V_{in,max}$. It should be noted that the actual levels of $V_{in}$ over which the results in FIG. 3 were measured are between 0.2 volts peak-to-peak and 2 volts peak-to-peak. Within a large portion of that range diode limiting cannot be used.

Figure 4:
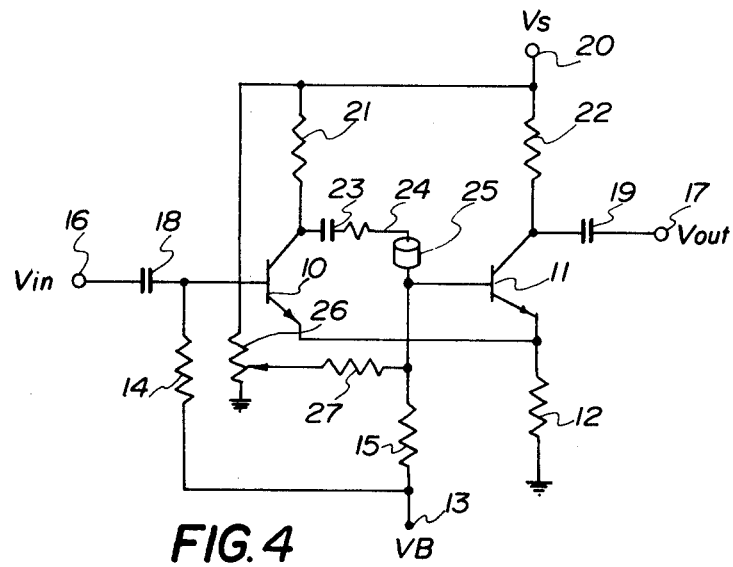
FIG. 4 is the schematic of a limiter circuit in accordance with the present invention.

Having briefly discussed the conventional emitter-coupled limiter and its limitations at the frequencies of interest, we now turn to the circuit of the preferred embodiment of the present invention. The circuit is shown in FIG. 4 and comprises two bipolar NPN transistors 10 and 11, having the emitters interconnected and connected to ground through a resistor 12; the transistors 10 and 11 having their bases connected to a d.c. biasing supply voltage $V_B$ at terminal 13 through resistors 14 and 15, respectively; the base of the transistor 10 and the collector of the transistor 11 are connected to input and output terminals 16 and 17 through capacitors 18 and 19, respectively; the collectors of the transistors 10 and 11 are connected to the main supply voltage $V_S$, applied between terminal 20 and ground, through resistors 21 and 22, respectively; and the collector of the transistor 10 is coupled to the base of the transistor 11 through a series connection of a resistor 23, a capacitor 24 and a delay line 25. In addition, and if the transistors 10 and 11 are not perfectly matched (i.e. identical in characteristics), which is usually the case, a potentiometer 26 connected between $V_S$ and ground is provided, the wiper of which is connected to the base of the transistor 11 through resistor 27. The potentiometer 26 provides a means by which a difference in the emitter-base voltages of the transistors 10 and 11 may be compensated.

Figure 5:
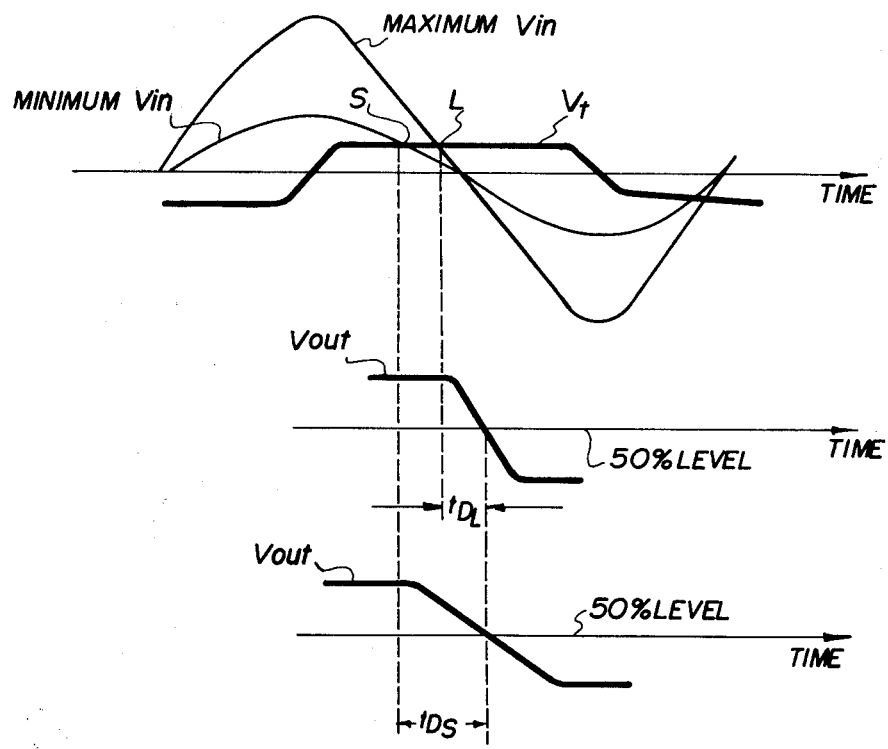
FIG. 5 illustrates how the improved phase response is achieved by the circuit in FIG. 4.

In the circuit of FIG. 4, the capacitor 23 is a d.c. blocking capacitor. The resistor 24 serves as attenuator of the signal at the collector of the transistor 10, which attenuated signal is then applied via the delay line 25 to the base of the transistor 11. The top illustration of FIG. 5 shows the attenuated trapezoidal signal $V_t$ as it appears at the base of the transistor 11 in proper phase relationship to the input signal $V_{in}$ at the base of the transistor 10 for the two cases of minimum and maximum $V_{in}$. The trapezoidal signal $V_t$ is out-of-phase by an angle of approximately $-5/2\pi$, (if the integral multiple of $2\pi$ is ignored, then the relative phase of $V_t$ with relation to $V_{in}$ simply is $-\pi/2$). A phase reversal of $\pi$ is introduced by the transistor 10, and the remainder of $3/2\pi$ is a delay introduced by the delay line 24. The intersection point L is the moment within one cycle at which the base voltages of the transistors 10 and 11 are equal for the case of maximum $V_{in}$. It is at this moment in the cycle that the transistors 10 and 11 change conduction states, the transistor 10 stopping conduction and the transistor 11 starting conduction. The corresponding transition of the output voltage $V_{out}$ is shown immediately thereunder in FIG. 5. The 50% level (or zero-crossing if one ignores the d.c. levels) of $V_{out}$ is reached after a time delay $t_{DL}$ from the point L. In case of the minimum $V_{in}$ the intersection point is S, which, of course, occurs earlier in the cycle than L. The corresponding transition of $V_{out}$ is shown at the bottom of FIG. 5, and the 50% level here is reached after a time delay $t_{DS}$ from S. The behaviour of the circuit respecting the positive transition of $V_{out}$ is analogous to what has just been described. Thus, it is clear that proper choice of the amplitude of $V_t$ would cause the 50% level of $V_{out}$ to be reached at a relatively constant phase angle within the cycle regardless of the amplitude of $V_{in}$, that is, as long as $V_{in}$ stays within preset bounds. The signal $V_t$ compensates the longer time delay in case of a small $V_{in}$ by causing the switching transition of the transistors 10 and 11 to begin progressively earlier in the cycle with decreasing $V_{in}$. Strictly speaking $V_t$ does not have to be derived from the collector of the transistor 10, but of course it is most opportune to do so.

The optimum amplitude for the signal $V_t$ is best determined experimentally. It would be presumptuous to give a rigid rule or formula for determining the amplitude of $V_t$; but preferably it should be less than the minimum operational $V_{in}$. The same applies to the determination of the optimum delay length, although it can be safely said that the phase difference between $V_t$ and $V_{in}$ should be in the vicinity of either of $-\pi/2$ or $+3/2\pi$, if integral multiples of $2\pi$ are ignored. This condition may be expressed as follows:

Phase Difference $= (-1)^n(2n - 1) \pi/2;$ where $n = 1, 2, 3, \ldots$ etc. It is important, though, to emphasize that the experimentally determined optimum phase difference may vary by as much as 30° or more from that of the above formula.

Figure 6:
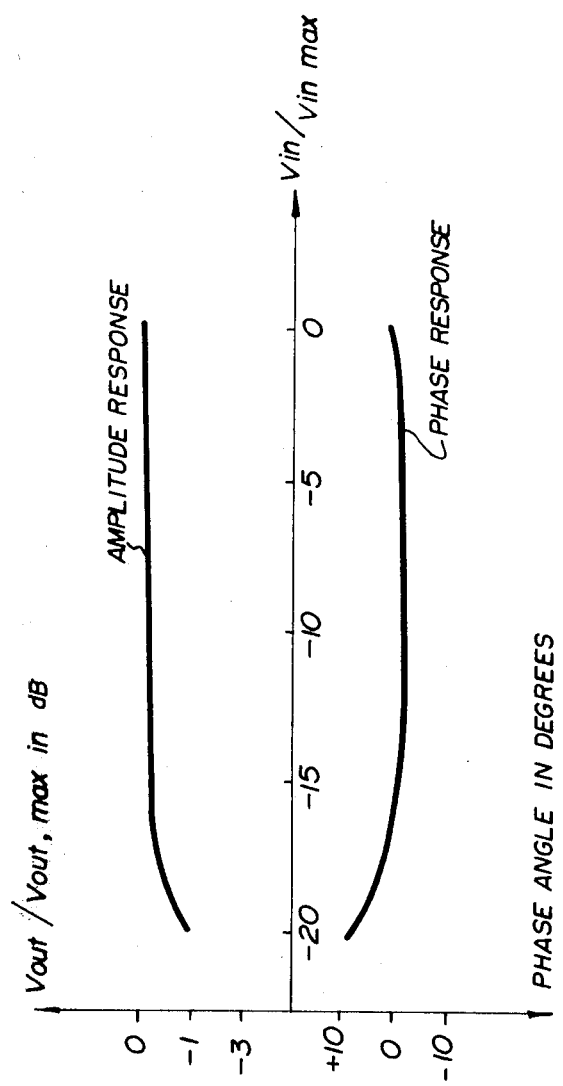
FIG. 6 depicts a typical phase and amplitude response of the circuit in FIG. 4.

Before turning to FIG. 6, showing the improved performance of the circuit of FIG. 4, the values and data of the components in that circuit will be listed below.

Figure 3:
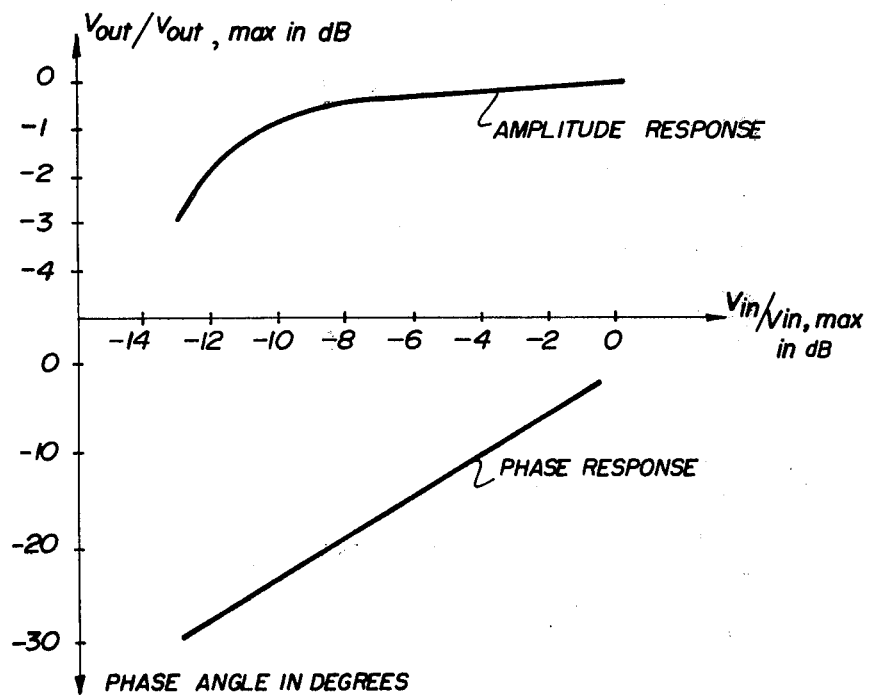
FIG. 3 depicts a typical phase and amplitude response of the circuit of FIG. 1.

Operating Frequency : 274.176 MHz
Range of $V_{in}$ : 20 dB (0.2 V p-p to 2 V p-p)
Transistors 10 and 11 : 2N5652 ($f_T \approx$ 4 GHz, $C_{ob} \approx$ 0.5pF)
Delay line 25 : 2.8 nanosecond (causing approximately 280° phase delay at the operating frequency of 274.176 MHz)
Resistor 24 : 27 Ohm
Resistors 12 : 220 Ohm, 14 : 82 Ohm, 15 : 220 Ohm, 21 : 24 Ohm, 22 : 82 Ohm, 27 : 10K Ohm
Potentiometer 26 : 10K Ohm
d.c. blocking capacitors 18 : 0.01μF, 19 : 0.01μF, 23 : 0.01μF
supply voltages $V_s$ : 14.5 Volts, $V_B$ : 6.2 Volts In FIG. 6, the upper curve is the amplitude response of a typical circuit having the above values. As may be ascertained the amplitude of $V_{out}$ varies little over 1 dB over a corresponding variation in $V_{in}$ of ca. 20 dB, while the phase response depicted by the lower curve varies by ca. 10° over the 20 dB variation in $V_{in}$. Comparing FIG. 6 with FIG. 3 shows how the superposition of $V_t$ at the base of the transistor 11 clearly improved the performance of the prior art limiter shown in FIG. 1. As to a comparison between the performance shown in FIG. 6 and prior art diode limiters (not shown), there is some deterioration in the phase response, particularly towards the minimum amplitude of $V_{in}$. In most instances such deterioration is within acceptable limits (10°).

While the preferred circuit of FIG. 4 has the resistor 15 as a current source, a transistor or other suitable current source may be utilized. This, however, is not mandatory and a resistor, when sufficient, has the advantage of lower cost.

The herein disclosed preferred embodiment has one disadvantage which, however, and at least in the present application, does not lessen its utility. If the circuit in FIG. 4 is not driven by the input signal, an "astable mode" of oscillation sets on at about 1 MHz. Such astable mode results from the capacitor 23 which causes the circuit to operate as an astable multivibrator at lower frequencies, because the delay line 25 has negligible delay at such frequencies. The capacitor 23 may thus be chosen to yield a frequency of oscillation that is well below the actual operational frequency of the circuit. In the present embodiment 1 MHz is sufficiently removed from 274.176 MHz. It is only necessary to ensure that the spurious astable mode is in fact suppressed upon applying the minimum $V_{in}$ to its input. This condition is not the limiting factor on the minimum value of $V_{in}$ in the application at hand.

What is claimed is:

1. A limiter circuit for a periodic input signal having varying amplitudes, comprising:
   a. first and second switching devices connected and biased to operate in current mode switch operation;
   b. means for applying said input signal to a control electrode of said first switching device;
   c. means, including a series direct current blocking means, connected between an output electrode of said first switching device and a control electrode of said second switching device for applying a delayed, attenuated version of the signal appearing at said output electrode to said control electrode, whereby said delayed, attenuated version has at the control electrode a predetermined amplitude and a predetermined difference in phase with respect to said input signal.

2. The limiter defined in claim 1, said first and second switching devices being first and second bipolar transistors.

3. The limiter defined in claim 2, said first input signal being substantially sinusoidal and said output electrode of said first switching device being the collector.

4. The limiter defined in claim 3, said second periodic signal being delayed by the time equivalent of an optimum phase angle in the vicinity of $3/2\pi$ plus an integral multiple of $2\pi$.

5. The limiter defined in claim 2, said second periodic signal being substantially trapezoidal and having an optimum amplitude smaller than the lowest expected amplitude of said input signal.

6. The limiter defined in claim 3, said second periodic signal being substantially trapezoidal and having an optimum amplitude smaller than the lowest expected amplitude of said input signal.

7. The limiter defined in claim 4, said second periodic signal being substantially trapezoidal and having an optimum amplitude smaller than the lowest expected amplitude of said input signal.

8. The limiter defined in claim 2 wherein a limited output version of said input signal is obtained at the collector of said second switching device.

9. The limiter defined in claim 3 wherein a limited output version of said input signal is obtained at the collector of said second switching device.

10. The limiter defined in claim 4 wherein a limited output version of said input signal is obtained at the collector of said second switching device.

11. The limiter defined in claim 4, said delayed attenuated version being obtained at the base of said second bipolar transistor by interconnecting said base and the collector of said first bipolar transistor via a series connection of a capacitor, a resistor and a delay line.

12. The limiter defined in claim 11, said capacitor having sufficient capacity to cause said limiter circuit to oscillate in its astable mode at a frequency removed from the frequency of said input signal when the latter is below a preset minimum amplitude.

13. The limiter defined in claim 1, said predetermined difference in phase being in the vicinity of $(-1)^n (2n - 1) \pi/2$ wherein $n$ defines any positive integer.

14. The limiter defined in claim 2, said predetermined difference in phase being in the vicinity of $(-1)^n (2n - 1) \pi/2$ wherein $n$ defines any positive integer.

15. A limiter circuit for a periodic input signal having varying amplitude for limiting the timing sinusoid extracted from a high speed pulse stream and preamplified to have a predetermined minimum operational level, comprising:
   a. a pair of high speed bipolar switching transistors of the same conductivity type, having a common emitter resistor to a common circuit terminal;
   b. means for biasing said transistor pair to operate in non-saturated current mode;
   c. means for coupling said timing sinusoid to the base of one of said pair of switching transistors; and
   d. a series connection of d-c blocking means, signal attenuating means and phase shifting means, for coupling the collector of said one of said pair of switching transistors to the base of the other.

16. The limiter of claim 15, said means for biasing including:
   a resistor connecting the collector of each of said pair of switching transistors to a first power terminal.

17. The limiter of claim 16, said means for biasing further including a resistor connecting the base of each of said pair of switching transistors to a second power terminal.

18. The limiter of claim 17, said first and second power terminals having said common circuit terminal as their common third terminal.

19. The limiter of claim 16, said means for biasing further including adjustable resistor means in the base circuit of one of said pair of switching transistors connected and adapted to vary the biasing of said one of said pair of switching transistors to compensate a mismatch in the base-emitter characteristics of the pair.

20. The limiter of claim 17, said means for biasing further including adjustable resistor means in the base circuit of one of said pair of switching transistors connected and adapted to vary the biasing of said one of said pair of switching transistors to compensate a mismatch in the base-emitter characteristics of the pair.

21. The limiter of claim 18, said means for biasing further including adjustable resistor means in the base circuit of one of said pair of switching transistors connected and adapted to vary the biasing of said one of said pair of switching transistors to compensate a mismatch in the base-emitter characteristics of the pair.

22. The limiter of claim 16, said means for coupling said timing sinusoid being a d-c blocking capacitor, and the collector of said other of said pair of switching transistors being coupled to an output terminal of said limiter circuit by a d-c blocking capacitor.

23. The limiter of claim 17, said means for coupling said timing sinusoid being a d-c blocking capacitor, and the collector of said other of said pair of switching transistors being coupled to an output terminal of said limiter circuit by a d-c blocking capacitor.

24. The limiter of claim 18, said means for coupling said timing sinusoid being a d-c blocking capacitor, and the collector of said other of said pair of switching transistors being coupled to an output terminal of said limiter circuit by a d-c blocking capacitor.

* * * * *